US007163877B2

(12) United States Patent
Niimi et al.

(10) Patent No.: US 7,163,877 B2
(45) Date of Patent: Jan. 16, 2007

(54) METHOD AND SYSTEM FOR MODIFYING A GATE DIELECTRIC STACK CONTAINING A HIGH-K LAYER USING PLASMA PROCESSING

(75) Inventors: Hiroaki Niimi, Dallas, TX (US); Luigi Colombo, Dallas, TX (US); Koji Shimomura, Yamanashi (JP); Takuya Sugawara, Yamanashi (JP); Tatsuo Matsudo, Yamanashi (JP)

(73) Assignees: Tokyo Electron Limited, Tokyo (JP); Texas Instruments, Inc., Dallas, TX (US)

( * ) Notice: Subject to any disclaimer, the term of this patent is extended or adjusted under 35 U.S.C. 154(b) by 180 days.

(21) Appl. No.: 10/920,990

(22) Filed: Aug. 18, 2004

(65) Prior Publication Data

US 2006/0040483 A1    Feb. 23, 2006

(51) Int. Cl.
*H01L 21/21* (2006.01)
*H01L 21/42* (2006.01)

(52) U.S. Cl. ............... 438/513; 438/197; 438/423
(58) Field of Classification Search ............... 438/513, 438/514, 515, 423, 197, 602, 603, 604, 536, 438/905, 935, 474, 475, 770, 775
See application file for complete search history.

(56) References Cited

U.S. PATENT DOCUMENTS

| 6,709,715 | B1* | 3/2004 | Lang et al. | 427/489 |
| 6,730,566 | B1 | 5/2004 | Niimi et al. | 438/275 |
| 6,787,861 | B1* | 9/2004 | Lucovsky et al. | 257/410 |
| 2003/0025146 | A1 | 2/2003 | Narwankar et al. | 257/310 |
| 2004/0009642 | A1 | 1/2004 | Yoo et al. | 438/257 |
| 2004/0110361 | A1 | 6/2004 | Parker et al. | 438/484 |
| 2005/0106893 | A1* | 5/2005 | Wilk | 438/758 |
| 2005/0247985 | A1 | 11/2005 | Watanabe et al. | 257/411 |

FOREIGN PATENT DOCUMENTS

| WO | WO 2004/004014 | 1/2004 |
| WO | WO 2004/044898 | 5/2004 |

OTHER PUBLICATIONS

Gerald Lucovsky et al., *Plasma Processed Ultra-thin SiO, Interfaces for Advanced Silicon NMOS and PMOS Devices; Applications to Si-Oxide/Si Oxynitride, Si-Oxide/Sl Nltride and Si-Oxide/Transition Metal Oxide Slacked Gate Dielectrics*, Thin Solid Films 374 (2000) pp. 217-227.

(Continued)

*Primary Examiner*—David Nhu
(74) *Attorney, Agent, or Firm*—Wood, Herron & Evans, LLP

(57) ABSTRACT

A method and system for modifying a gate dielectric stack by exposure to a plasma. The method includes providing the gate dielectric stack having a high-k layer formed on a substrate, generating a plasma from a process gas containing an inert gas and one of an oxygen-containing gas or a nitrogen-containing gas, where the process gas pressure is selected to control the amount of neutral radicals relative to the amount of ionic radicals in the plasma, and modifying the gate dielectric stack by exposing the stack to the plasma.

51 Claims, 9 Drawing Sheets

OTHER PUBLICATIONS

Seiji Inumiya et al., *Fabrication of HfSiON Gate Dielectrics by Plasma Oxidation and Nitridation, Optimized for 66nm Node Low Power CMOS Applications*, 2003 Symposium on VLSI Technology Digest of Technical Papers, pp. 17-18.

Chris Hinkle et al., *Remote Plasma-Assisted Nitridation (RPN): Applications to Zr and Hf Silicate Alloys and $Al_2O_3$*, Applied Surface Science 216 (2003) pp. 124-132.

European Patent Office. *International Search Report and Written Opinion*, PCT/US2005/028610, dated Dec. 29, 2005, 11 pp.

\* cited by examiner

METHOD AND SYSTEM FOR MODIFYING A GATE DIELECTRIC STACK CONTAINING A HIGH-K LAYER USING PLASMA PROCESSING

FIELD OF THE INVENTION

The present invention relates to semiconductor processing, and more particularly, to a plasma processing method for modifying a gate dielectric stack containing a high-k layer.

BACKGROUND OF THE INVENTION

In the semiconductor industry, the minimum feature sizes of microelectronic devices are well into the deep sub-micron regime to meet the demand for faster, and lower power semiconductor devices. The downscaling of complimentary metal-oxide-semiconductor (CMOS) devices imposes scaling constraints on the gate dielectric material. The thickness of the conventional $SiO_2$ gate dielectric is approaching its physical limits. The most advanced devices are using nitrided $SiO_2$ gate dielectrics approaching equivalent oxide thickness (EOT) of about 1 nanometer (nm) or less where the leakage current density can be as much as 1 $mA/cm^2$. To improve device reliability and reduce electrical leakage from the gate dielectric to the transistor channel during operation of the device, semiconductor transistor technology is planning on using high dielectric constant (high-k) gate dielectric materials that allow increased physical thickness of the gate dielectric layer while maintaining a low equivalent oxide thickness (EOT). Equivalent oxide thickness is defined as the thickness of $SiO_2$ that would produce the same capacitance voltage curve as that obtained from an alternate dielectric material.

Dielectric materials featuring a dielectric constant greater than that of $SiO_2$ (k~3.9) are commonly referred to as high-k materials. High-k materials may refer to dielectric materials that are deposited onto substrates (e.g., $HfO_2$, $ZrO_2$, HfSiO, ZrSiO, etc) rather than grown on the surface of the substrate as is the case for $SiO_2$. High-k materials may incorporate a metal oxide layer or a metal silicate layer, e.g., $Ta_2O_5$ (k~26), $TiO_2$ (k~80), $ZrO_2$ (k~25), $Al_2O_3$ (k~9), HfSiO (k~5–20), and $HfO_2$ (k~25).

Integration of high-k materials into gate stacks can require a dielectric interfacial layer at the surface of the Si substrate to preserve interface state characteristics and form an interface with good electrical properties. However, the presence of an oxide interfacial layer lowers the overall dielectric constant of the stack and, therefore, the oxide interfacial layer may need to be thin. The quality of the interfacial oxide dielectric layer can affect device performance, as the oxide layer is intimately connected to the channel of the transistor.

As-deposited high-k gate dielectric layers commonly contain point defects, vacancies or impurities that are incorporated into the high-k layers during the deposition process. These defects can be the source of high leakage currents in the dielectric layer and may eventually be responsible for premature failure of the dielectric layer and the microelectronic device. Annealing procedures have been developed to decrease these point defects, however, high temperatures are usually required for maximum improvement, which can increase the thickness of the interfacial oxide layer.

SUMMARY OF THE INVENTION

A method and system are provided for modifying a gate dielectric stack by exposure to a plasma. The method includes providing a gate dielectric stack having a high-k layer on a substrate, generating a plasma from a process gas containing an inert gas and an oxygen-containing gas, or an inert gas and a nitrogen-containing gas, wherein the process gas pressure is selected to control the amount of neutral radicals relative to the amount of ionic radicals in the plasma, and modifying the gate dielectric stack by exposing the stack to the plasma.

In one embodiment of the invention, the plasma can be generated from a process gas containing an inert gas and an oxygen-containing gas, wherein the process gas pressure is selected to increase the amount of neutral oxygen radicals relative to the amount of ionic oxygen radicals in the plasma. The plasma process modifies the gate dielectric stack by increasing the dielectric constant of the high-k layer through reducing defects in the layer, incorporating oxygen in the layer, or removing carbon impurities or any other impurities from the layer.

In another embodiment of the invention, the plasma can be generated from a process gas containing an inert gas and a nitrogen-containing gas, wherein the process gas pressure is selected to increase the amount of ionic nitrogen radicals relative to the amount of neutral nitrogen radicals in the plasma. The plasma process modifies the gate dielectric stack by increasing the nitrogen content of the high-k layer.

The plasma processing system includes a plasma source for generating a plasma from a process gas containing an inert gas and an oxygen-containing gas, or an inert gas and a nitrogen-containing gas, wherein the process gas pressure is selected to control the amount of neutral radicals relative to the amount of ionic radicals in the plasma, a substrate stage configured for supporting a substrate containing a gate dielectric stack having a high-k layer on the substrate, wherein the substrate stage is further configured for exposing the gate dielectric stack to the plasma, thereby modifying the gate dielectric stack, a substrate transfer system configured for transferring the substrate to and from the substrate stage, and a controller configured to control the plasma processing system.

DETAILED DESCRIPTION OF EMBODIMENTS OF THE INVENTION

Figure 1A:
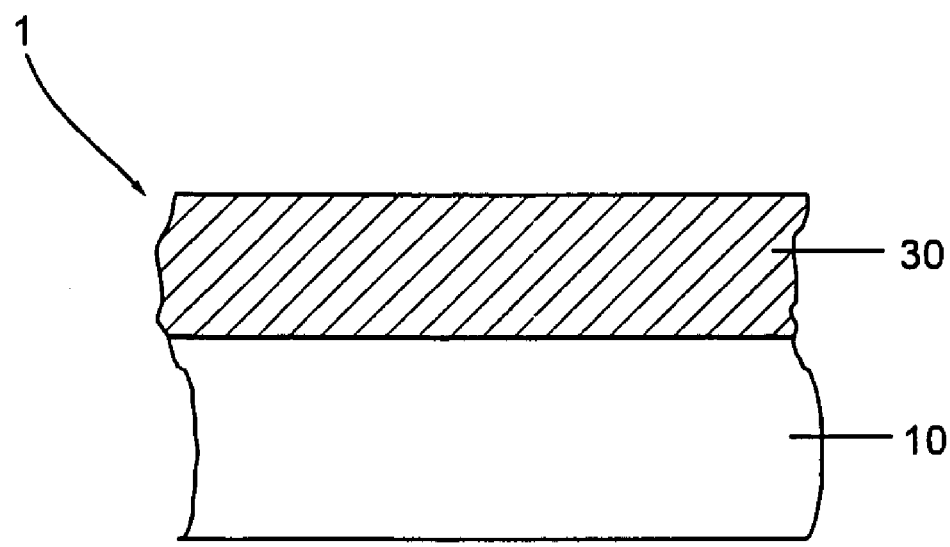
FIG. 1A shows a gate dielectric stack containing a high-k layer according to an embodiment of the invention.

FIG. 1A shows a gate dielectric stack containing a high-k layer according to an embodiment of the invention. The gate dielectric stack 1 contains a substrate 10 and a high-k layer 30 on the substrate 10. The substrate 10 can, for example, be a semiconductor substrate, such as a Si substrate, a Ge-containing Si substrate, a Ge substrate, or a compound semiconductor substrate, and can include numerous active devices and/or isolation regions (not shown). The substrate 10 can be of n- or p-type, depending on the type of device being formed. The high-k layer 30 can, for example, be a metal-oxide layer or a metal silicate layer, for example $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, or $LaSiO_x$, or a combination of two or more thereof. The high-k layer 30 can, for example, be about 3 nm thick.

Figure 1B:
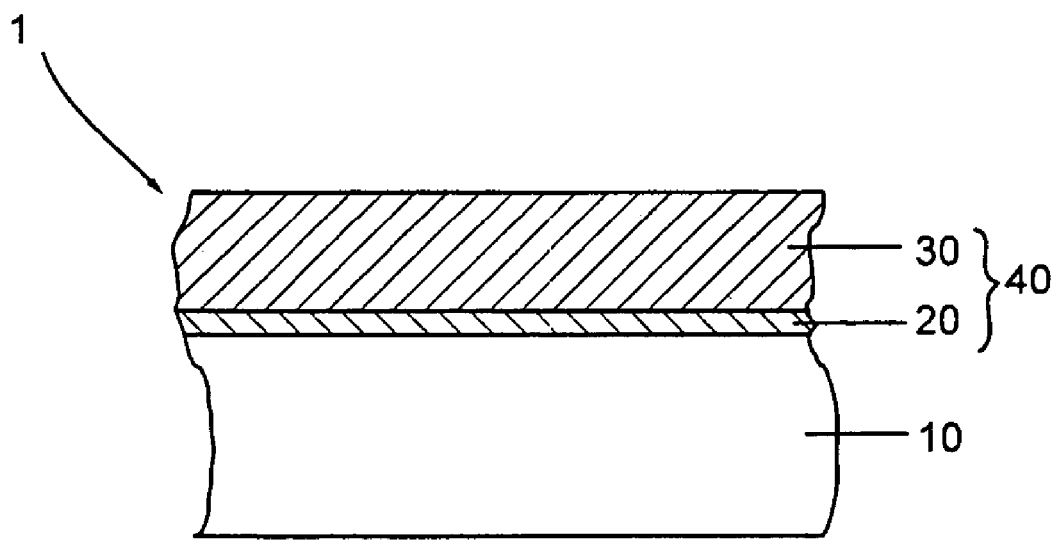
FIG. 1B shows a gate dielectric stack containing a high-k layer and an interfacial layer according to an embodiment of the invention.

FIG. 1B shows a gate dielectric stack containing a high-k layer and an interfacial layer according to an embodiment of the invention. The gate dielectric stack 1 contains a substrate 10 and a dielectric layer 40 that includes an interfacial layer 20 on the substrate 10 and a high-k layer 30 on the interfacial layer 20. The interfacial layer 20 can, for example, contain an oxide layer (e.g., $SiO_x$), a nitride layer (e.g., $SiN_x$), or an oxynitride layer (e.g., $SiO_xN_y$).

In one embodiment of the invention, the inventors have identified a plasma process for modifying gate dielectric stack 1 in FIGS. 1A and 1B by exposing the gate dielectric stack 1 to an oxygen-containing plasma at a high process gas pressure (high-pressure plasma). The high-pressure plasma contains increased amount of neutral oxygen radicals (excited oxygen species) relative to the amount of ionic oxygen radicals, compared to low-pressure plasma. Modifying the gate dielectric stack 1 using a high-pressure oxygen-containing plasma can include increasing the dielectric constant of the high-k layer 30, reducing the amount of carbon impurities in the layer, reducing defects in the layer that give rise to high leakage currents or other electrical degradation aspects, or increasing the oxygen-content of the layer 30. Furthermore, the high-pressure plasma process minimizes growth (thickness) of the interfacial layer 20 compared to high-temperature thermal oxidation processes and low-pressure plasma processes, which also have a higher concentration of ionic oxygen radicals relative to neutral oxygen radicals.

Oxygen-based plasmas can primarily contain two types of oxygen radicals: ionic oxygen radicals (e.g., $O_2^+$) and neutral (metastable) oxygen radicals (e.g., $O^*$). According to an embodiment of the current invention, the amount of neutral oxygen radicals in a plasma, relative to the amount of ionic oxygen radicals in the plasma, can be increased using high process gas pressure, for example, pressure between about 0.5 Torr and about 5 Torr. In another embodiment of the invention, the gas pressure can be between about 1 Torr and about 3 Torr, and can be 2 Torr. The process gas can contain an oxygen-containing gas including $O_2$, $O_3$, $H_2O$, or $H_2O_2$, or a combination of two or more thereof, and an inert gas including He, Ne, Ar, Kr, or Xe, or a combination of two or more thereof. In one embodiment of the invention, the process gas can contain Ar and $O_2$. In one embodiment of the invention, the ratio of the inert gas to the oxygen-containing gas can be between about 20 and about 5. In a further embodiment, the inert gas may be Ar and the oxygen-containing gas may be $O_2$, and the $Ar/O_2$ ratio is between about 20 and about 5. For comparison, low-pressure plasma processing that utilizes a process gas pressure between about 10 mTorr and about 200 mTorr contain higher amount of ionic oxygen radicals relative to neutral oxygen radicals.

In another embodiment of the invention, the inventors have identified a plasma process for modifying the gate dielectric stack 1 in FIGS. 1A and 1B by exposing the gate dielectric stack 1 to nitrogen-containing plasma at a low process gas pressure (P~200 mTorr). The plasma contains increased amount of ionic nitrogen radicals (e.g., $N_2^+$) relative to the amount of neutral nitrogen radicals (e.g., $N_2^*$), compared to a high process gas pressure plasma (P~800 mTorr).

Modifying the gate dielectric stack 1 using a low-pressure nitrogen-containing plasma increases the nitrogen-content of the high-k layer 30 while minimizing growth of the interfacial layer 20, thereby allowing better dielectric thickness scaling. Furthermore, the nitrogen content of the high-k layer 30 increases with increasing plasma exposure time. Low-pressure nitrogen-containing plasma minimizes growth of the interfacial layer 20 compared to high-temperature thermal nitridation (nitrogen-incorporation) processes that use $N_2O$ or NO gases and result in interfacial nitridation but limited nitridation of the high-k layer 30. Thermal nitridation processes using $NH_3$ also result in interfacial nitridation but limited nitridation of the high-k layer 30, and may need additional annealing steps to reduce hydrogen (H) content of the high-k layer 20. Also, plasma nitridation processes using high-pressure nitrogen plasma result in increased interfacial nitridation, and less nitridation of the high-k layer 30.

According to an embodiment of the current invention, the amount of ionic nitrogen radicals in a plasma, relative to the amount of neutral nitrogen radicals in the plasma, can be increased using low-pressure plasma. The process gas pressure can, for example, be between about 10 mTorr and about 400 mTorr. Alternately, the gas pressure can be between about 50 mTorr and about 300 mTorr, and can be 200 mTorr. The process gas can contain a nitrogen-containing gas including $N_2$ or $NH_3$, or a combination thereof, and an inert gas including He, Ne, Ar, Kr, or Xe, or a combination of two or more thereof. In one embodiment of the invention, the process gas can contain Ar and $N_2$. In one embodiment of the invention, the ratio of the inert gas to the nitrogen-containing gas can be between about 20 and about 500.

In another embodiment of the invention, the gate dielectric stack 1 in FIGS. 1A and 1B can by modified by exposure to a high-pressure oxygen-containing plasma (i.e., pressure between about 0.5 Torr and about 5 Torr) and, subsequently, the resulting modified gate dielectric stack can be exposed to a low-pressure nitrogen-containing plasma (i.e., pressure between about 10 mTorr and about 400 mTorr).

In yet another embodiment of the invention, the gate dielectric stack 1 in FIGS. 1A and 1B can by modified by exposure to a low-pressure nitrogen-containing plasma and, subsequently, the resulting modified gate dielectric stack can be exposed to a high-pressure oxygen-containing plasma.

FIGS. 2A–2F are schematic diagrams of plasma processing systems for modifying a gate dielectric stack according to embodiments of the invention. It is to be understood that the plasma processing systems depicted in FIGS. 2A–2F are shown for exemplary purposes only, as many variations of the specific hardware can be used to implement processing systems in which the present invention may be practiced, and these variations will be readily apparent to one having ordinary skill in the art. Like reference numerals are used to refer to like parts.

Figure 2A:
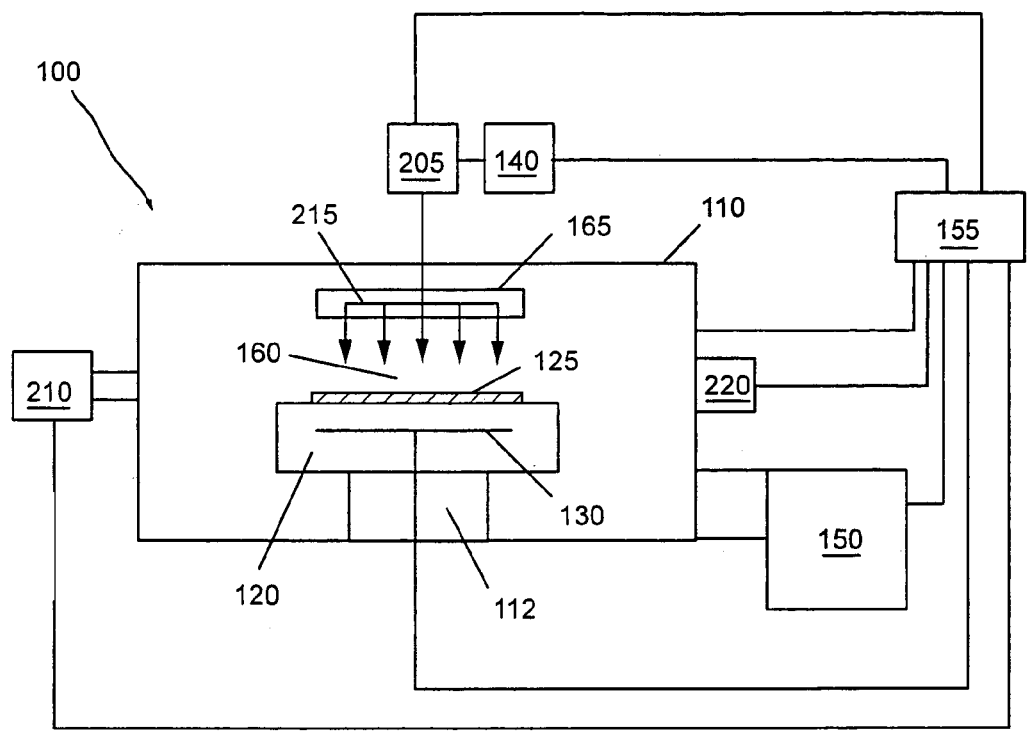
FIGS. 2A–2F are schematic diagrams of plasma processing systems for modifying a gate dielectric stack according to embodiments of the invention.

In FIG. 2A, the plasma processing system 100 includes a process chamber 110 having a pedestal 112 for mounting a substrate stage 120 that supports a substrate 125 and exposes the substrate 125 to the plasma processing region 160. The substrate stage 120 can be further configured for heating or cooling the substrate 125. The plasma processing system 100 further includes a gas injection system 140 for introducing a process gas to a remote plasma source 205, wherein the process gas contains an inert gas, and an oxygen-containing gas, or an inert gas and a nitrogen-containing gas. The gas injection system 140 allows independent control over the delivery of the process gas to the remote plasma source 205 from ex-situ gas sources (not shown).

Excited process gas 215 is introduced to the plasma processing region 160 from the remote plasma source 205. The excited process gas 215 can be introduced to the plasma processing region 160 through a gas injection plenum (not shown), a series of baffle plates (not shown) and a multi-orifice showerhead gas injection plate 165. Optical monitoring system 220 can be used to monitor optical emission from the plasma processing region 160. The process chamber 110 is connected to vacuum pump system 150 that can include a turbo-molecular vacuum pump (TMP) capable of a pumping speed up to about 5,000 liters per second (and greater), and a gate valve for controlling the gas pressure.

Substrate 125 is transferred in and out of process chamber 110 through a slot valve (not shown) and chamber feed-through (not shown) via a robotic substrate transfer system 210 where it is received by substrate lift pins (not shown) housed within substrate stage 120 and mechanically translated by devices housed therein. Once the substrate 125 is received from the substrate transfer system 210, it is lowered to an upper surface of the substrate stage 120.

The substrate 125 can be affixed to the substrate stage 120 via an electrostatic clamp (not shown). Furthermore, the substrate stage 120 includes a heater element 130 and the substrate stage 120 can further include a cooling system including a re-circulating coolant flow that receives heat from the substrate stage 120 and transfers heat to a heat exchanger system (not shown). Moreover, gas may be delivered to the backside of the substrate to improve the gas-gap thermal conductance between the substrate 125 and the substrate stage 120. Such a system can be utilized when temperature control of the substrate is required at elevated or reduced temperatures.

A controller 155 includes a microprocessor, a memory, and a digital I/O port capable of generating control voltages sufficient to communicate and activate inputs to the processing system 100 as well as monitor outputs from the processing system 100. Moreover, the controller 155 is coupled to and exchanges information with the process chamber 110, the gas injection system 140, the remote plasma source 205, the optical monitoring system 220, the heating element 130, the substrate transfer system 210, and the vacuum pump system 150. For example, a program stored in the memory can be utilized to control the aforementioned components of a processing system 100 according to a stored process recipe. One example of controller 155 is a DELL PRECISION WORKSTATION 610™, available from Dell Corporation, Austin, Tex.

Figure 2B:
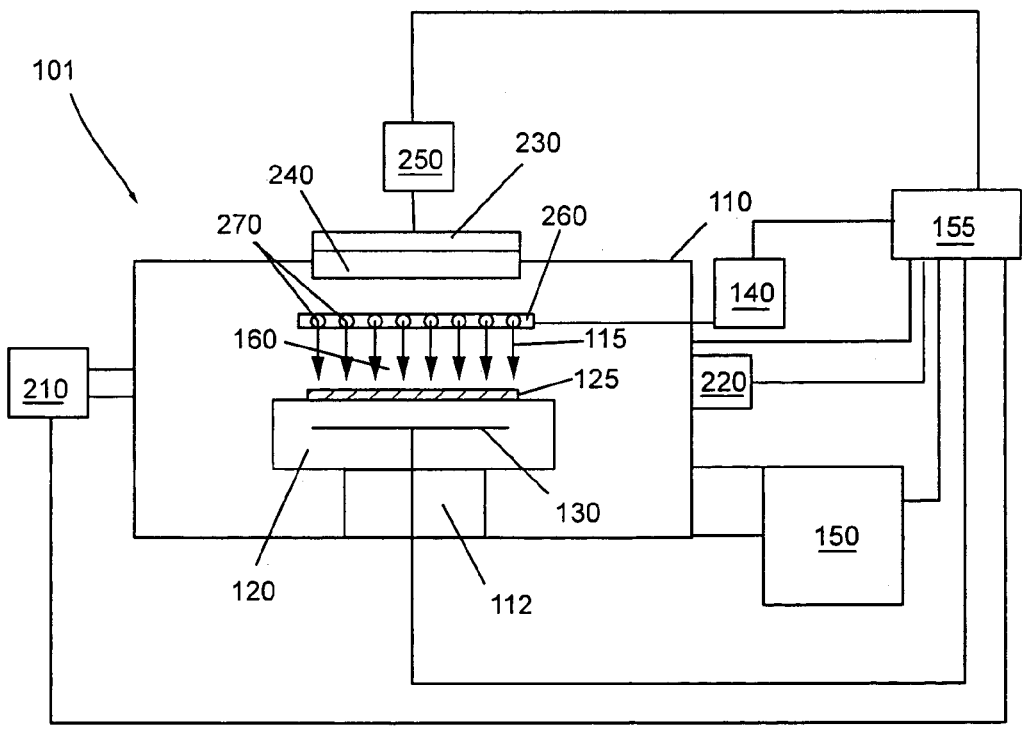

FIG. 2B shows a plasma processing system for modifying a gate dielectric stack according to an embodiment of the invention. The plasma processing system 101 contains a slot antenna 230 that is mounted on a microwave transmitting window 240. The window 240 can contain $Al_2O_3$ for efficient transmission of microwave radiation from external microwave plasma source 250 into the plasma processing region 160. The microwave power can, for example, be between about 500 Watts (W) and about 5000 W. The microwave frequency can, for example, be 2.45 GHz or 8.3 GHz. The gas injection system 140 is configured for delivering process gas to the interior of the process chamber 110 using a gas delivery ring 260 located between the window 240 and the substrate 125. The gas delivery ring 260 contains a plurality of gas injection holes 270 for introducing the process gas 115 into the plasma processing region 160 for excitation by the microwave-powered plasma. In FIG. 2B, the controller is coupled to and exchanges information with the process chamber 110, the gas injection system 140, the heating element 130, the vacuum pump system 150, the substrate transfer system 210, the optical monitoring system 220, and the external microwave plasma source 250.

Figure 2C:
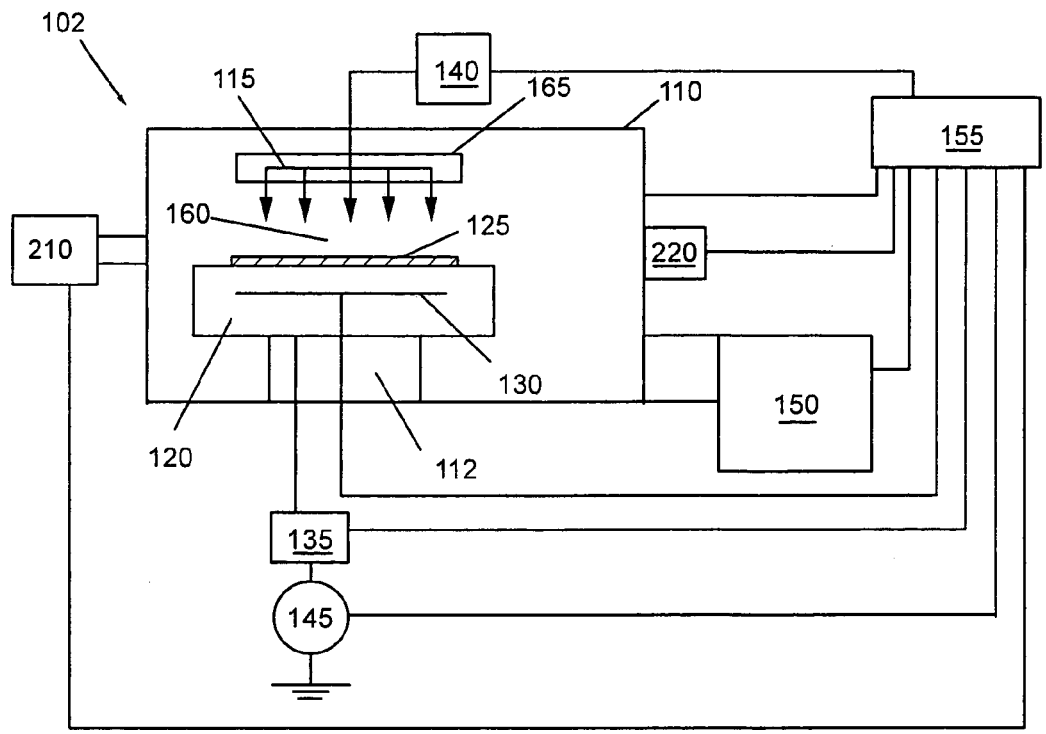

FIG. 2C shows a plasma processing system for modifying a gate dielectric stack according to an embodiment of the invention. The processing system 102 of FIG. 2C is capable of forming and sustaining plasma in the process chamber 110. In the embodiment shown in FIG. 2C, the substrate stage 120 can further serve as an electrode through which radio frequency (RF) power is coupled to plasma in the plasma processing region 160. For example, a metal electrode (not shown) in the substrate stage 120 can be electrically biased at a RF voltage via the transmission of RF power from an RF generator 145 through an impedance match network 135 to the substrate stage 120. The RF bias serves to heat electrons and, thereby, form and maintain a plasma. A typical frequency for the RF bias can range from about 0.1 MHz to about 100 MHz and can be about 13.6 MHz.

In an alternate embodiment, RF power can be applied to the substrate stage 120 at multiple frequencies. Furthermore, the impedance match network 135 serves to maximize the transfer of RF power to plasma in processing chamber 110 by minimizing the reflected power. Match network topologies (e.g., L-type, π-type, T-type) and automatic control methods are known in the art. The gas injection system 140 is configured for delivering process gas 115 to the plasma processing region through a multi-orifice showerhead gas injection plate 165 for excitation by the RF-powered plasma. In FIG. 2C, the controller 155 is coupled to and exchanges information with the process chamber 110, the RF generator 145, the impedance match network 1.35, the gas injection system 140, the optical monitoring system 220, the heating element 130, the substrate transfer system 210, and the vacuum pump system 150.

Figure 2D:
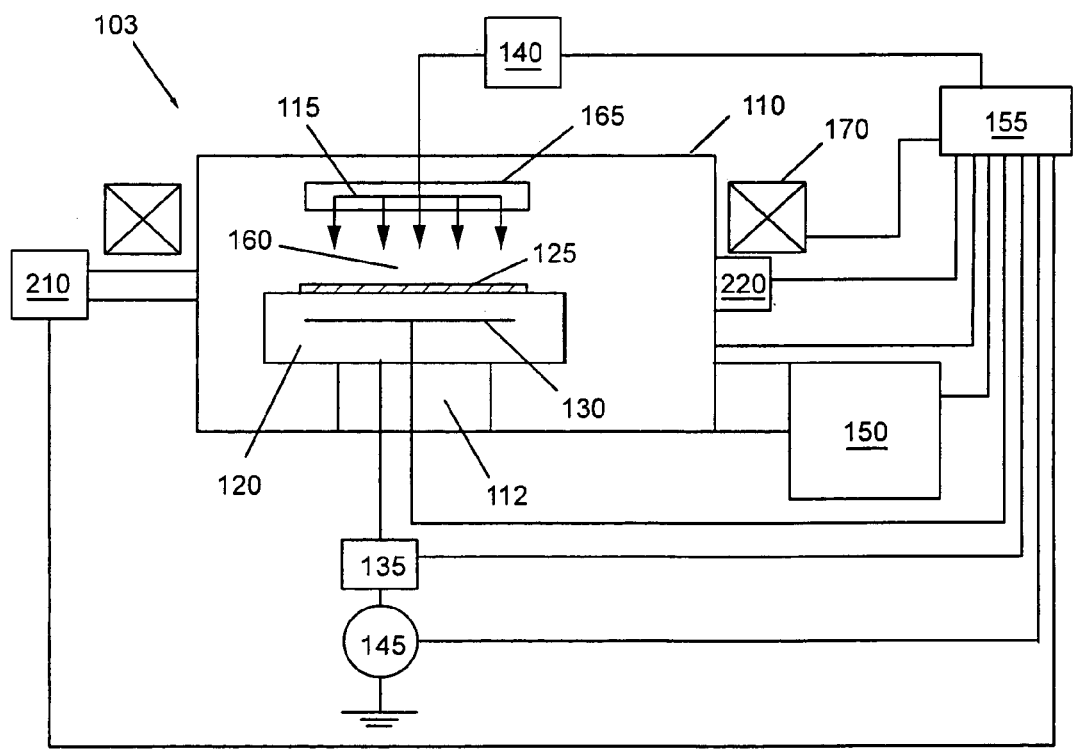

FIG. 2D shows a plasma processing system for modifying a gate dielectric stack according to an embodiment of the invention. The processing system 103 of FIG. 2C further includes either a mechanically or electrically rotating DC magnetic field system 170 to potentially increase plasma density and/or improve plasma processing uniformity, in addition to those components described with reference to FIG. 2C. Moreover, the controller 155 is coupled to the rotating magnetic field system 170 in order to regulate the speed of rotation and field strength.

Figure 2E:
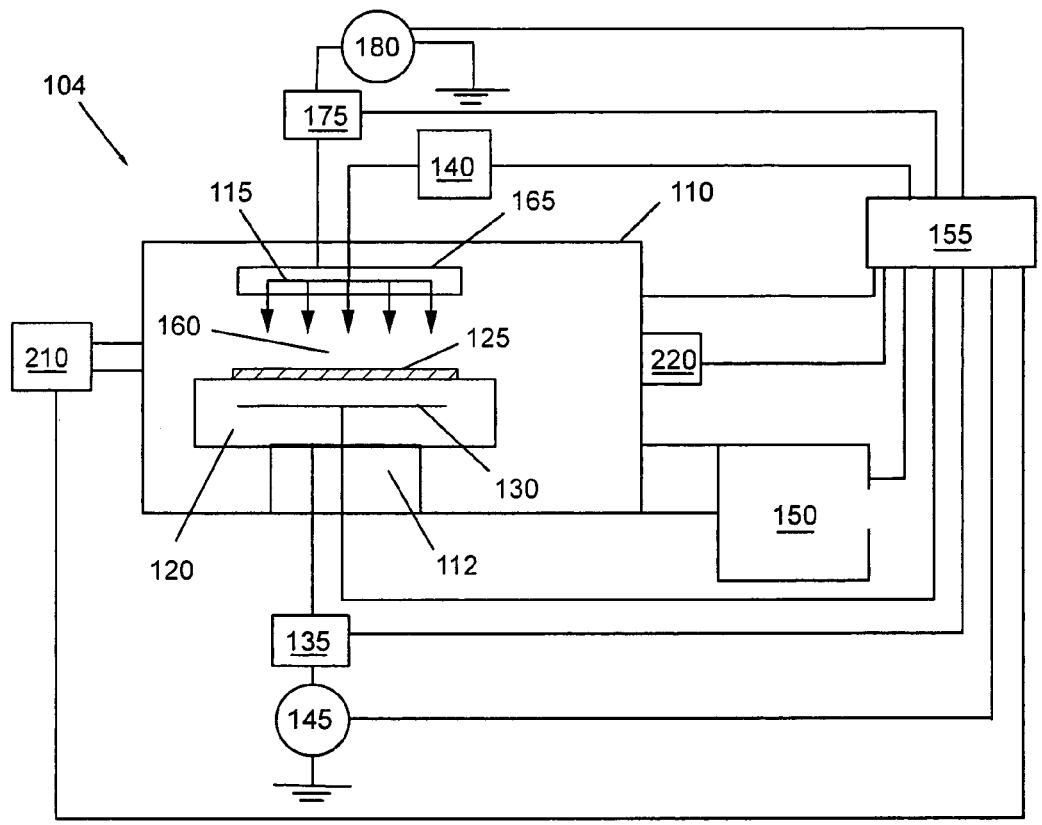

FIG. 2E shows a plasma processing system for modifying a gate dielectric stack according to an embodiment of the invention. The processing system 104 of FIG. 2E includes, in addition to those components described with reference to FIG. 2C, a multi-orifice showerhead gas injection plate 165 that can also serve as an upper plate electrode to which RF power is coupled from an RF generator 180 through an impedance match network 175. A frequency for the application of RF power to the upper electrode can range from about 10 MHz to about 200 MHz and can be about 60 MHz. Additionally, a frequency for the application of power to the lower electrode (substrate stage 120) can range from about 0.1 MHz to about 30 MHz and can be about 2 MHz. Moreover, the controller 155 is coupled to the RF generator 180 and the impedance match network 175 in order to control the application of RF power to the upper electrode 165.

In one embodiment of the invention, the substrate stage 120 in FIG. 2E can be electrically grounded. In an alternate embodiment, a DC bias can be applied to the substrate stage 120. In still another embodiment, the substrate stage 120 can be electrically isolated from the processing system 104. In this setup, a floating potential can be formed on the substrate stage 120 and on the substrate 125 when the plasma is on.

Figure 2F:
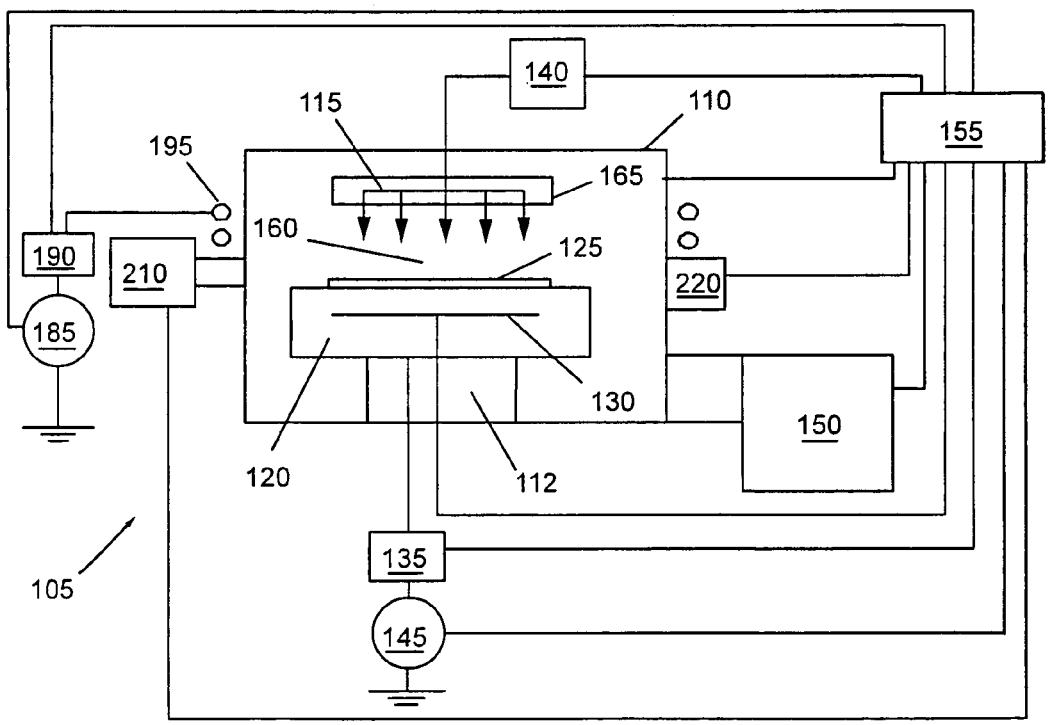

FIG. 2F shows a plasma processing system for modifying a gate dielectric stack according to an embodiment of the present invention. In addition to those components described with reference to FIG. 2C, the processing system 105 of FIG. 2F further includes an inductive coil 195 to which RF power is coupled via a RF generator 185 through an impedance match network 190. RF power is inductively coupled from the inductive coil 195 through a dielectric window (not shown) to the plasma processing region 160. A frequency for the application of RF power to the inductive coil 195 can range from about 0.1 MHz to about 100 MHz and can be about 13.6 MHz. Similarly, a frequency for the application of power to the substrate stage 120 can range from about 0.1 MHz to about 100 MHz and can be about 13.6 MHz. In addition, a slotted Faraday shield (not shown) can be employed to reduce capacitive coupling between the inductive coil 195 and plasma. Moreover, the controller 155 is coupled to the RF generator 185 and the impedance match network 190 in order to control the application of power to the inductive coil 195.

In one embodiment of the invention, the substrate stage 120 in FIG. 2F can be electrically grounded. In an alternate embodiment, a DC bias can be applied to the substrate stage 120. In still another embodiment, the substrate stage 120 can be electrically isolated from the processing system 105. In this setup, a floating potential can be formed on the substrate stage 120 and on the substrate 125 when the plasma is on.

In another embodiment, the plasma can be formed using electron cyclotron resonance (ECR). In still another embodiment, the plasma can be formed from the launching of a Helicon wave. In another embodiment, the plasma can be formed from a propagating surface wave.

Figure 3A:
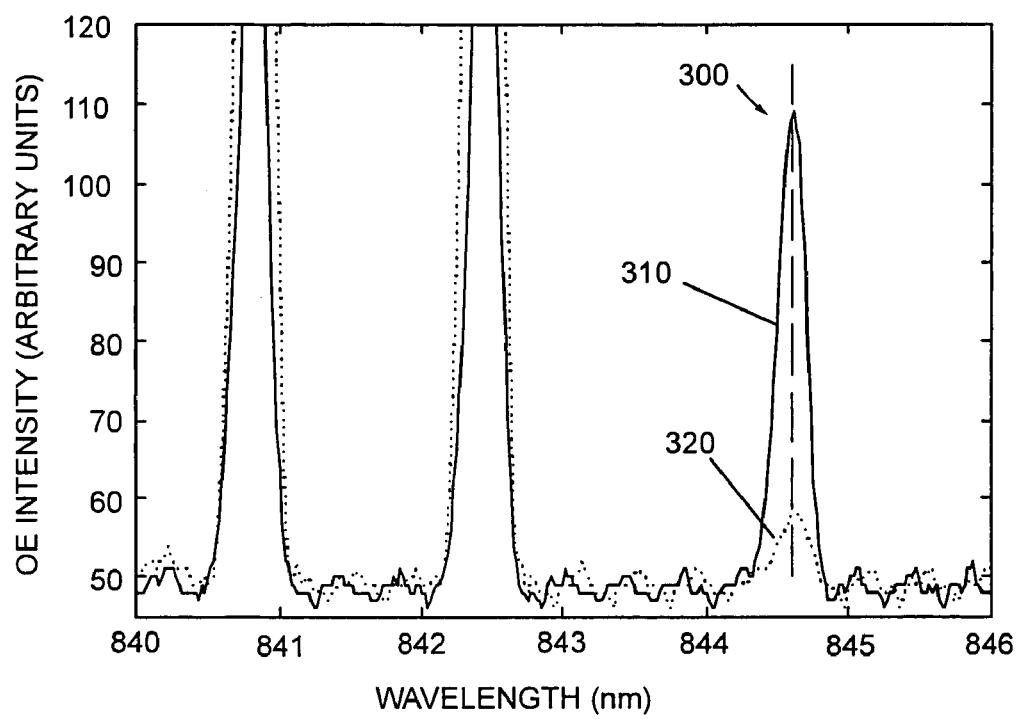
FIGS. 3A and 3B show optical emission (OE) intensity as a function of wavelength for an oxygen-containing plasma according to an embodiment of the invention.
Figure 3B:
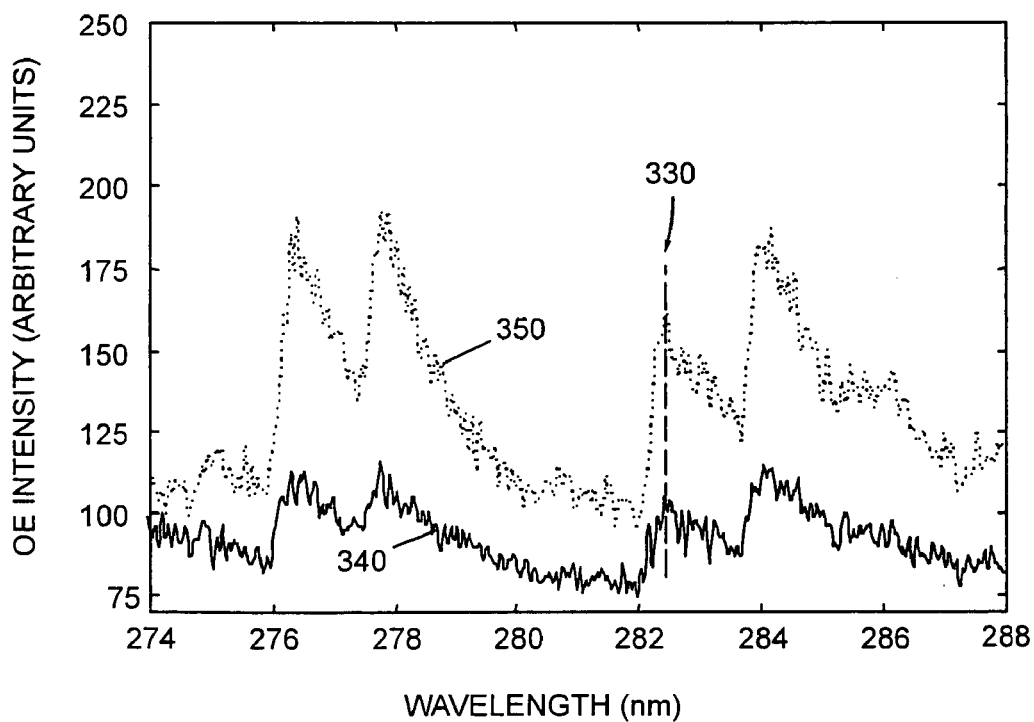

FIGS. 3A and 3B show optical emission (OE) intensity as a function of wavelength for an oxygen-containing plasma according to an embodiment of the invention. A plasma processing system 101 schematically shown in FIG. 2B was utilized to generate plasma from a process gas containing $O_2$ and Ar. FIG. 3A shows an OE feature 300 with maximum intensity at a wavelength of about 844.6 nm that is assigned to light emission from neutral O* radicals in the plasma. Curve 310 shows the measured O* intensity for a process gas pressure of 2 Torr, whereas curve 320 shows the measured O* intensity for a process gas pressure of 50 mTorr. The plasma parameters further included an Ar gas flow rate of 2000 standard cubic centimeters per minute (sccm), an $O_2$ gas flow rate of 200 sccm, and plasma power of 2000 W. FIG. 3A shows that increasing the process gas pressure increases the amount of neutral O* radicals in the plasma.

FIG. 3B shows an OE feature 330 with maximum intensity at a wavelength between about 282 nm and about 283 nm that is assigned to light emission from ionic $O_2^+$ radicals in the plasma. Curve 340 shows the measured $O_2^+$ intensity for a process gas pressure of 2 Torr, whereas curve 350 shows the measured $O_2^+$ intensity for a process gas pressure of 50 mTorr. Other plasma parameters were the same as in FIG. 3A. FIG. 3B shows that increasing the process gas pressure decreases the amount of ionic $O_2^+$ radicals in the plasma.

In summary, FIGS. 3A and 3B show that the relative amount of neutral O* radicals to ionic $O_2^+$ radicals in an oxygen-containing plasma can be controlled over a wide range by varying the process gas pressure. In particular, a high process gas pressure allows for generating an oxygen-containing plasma with an increased amount of neutral O* radicals relative to the amount of ionic $O_2^+$ radicals. We estimate that the $O^*/O_2^+$ ratio is about 10 at a low pressure of about 50 mTorr and that the $O^*/O_2^+$ ratio is about 114 at a high pressure of about 2 Torr.

Figure 4A:
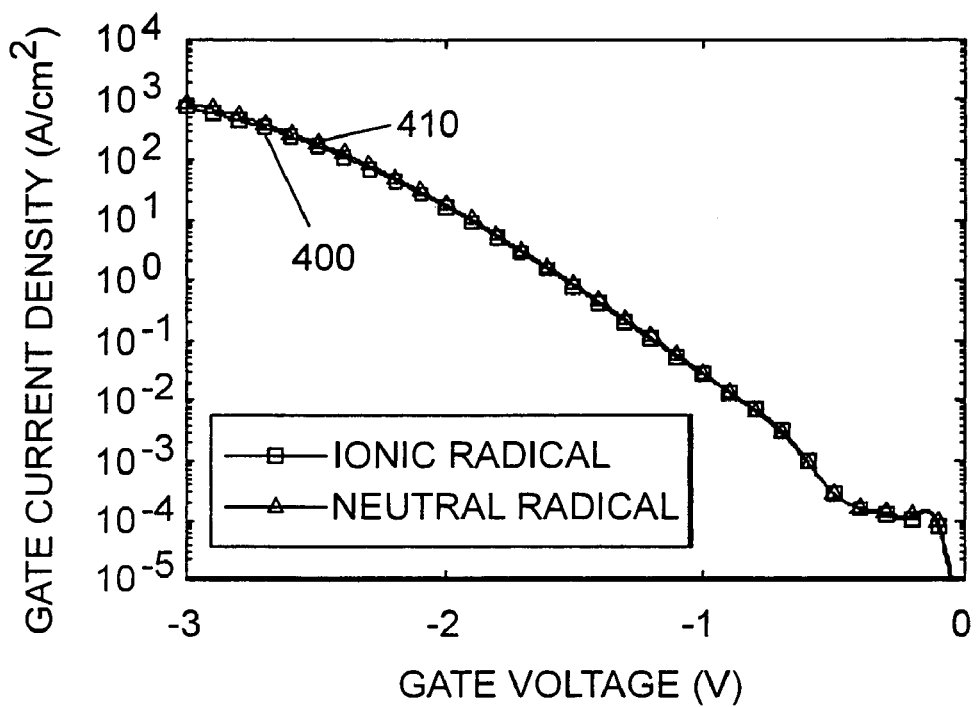
FIGS. 4A and 4B show electrical characteristics for a plasma modified gate dielectric stack according to an embodiment of the invention.
Figure 4B:
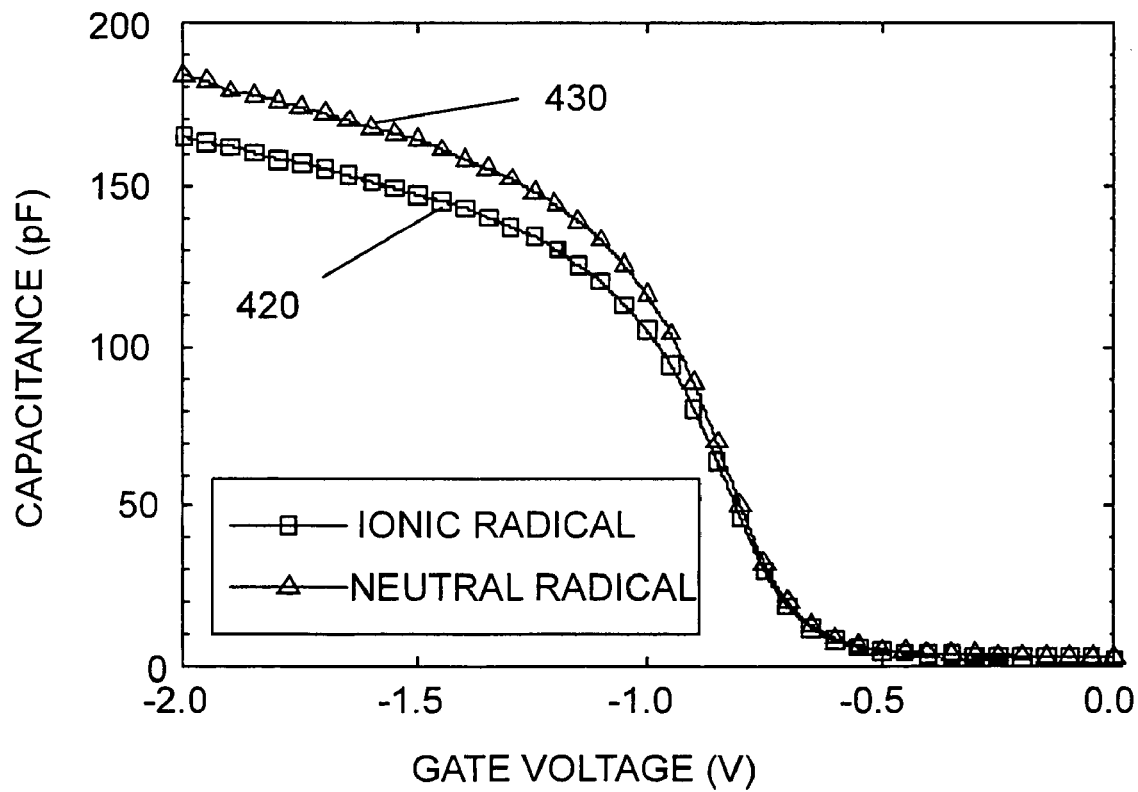

FIGS. 4A and 4B show electrical characteristics for a plasma modified gate dielectric stack according to an embodiment of the invention. FIG. 4A shows the gate current density of a plasma modified gate dielectric stack as a function of gate voltage. Curves 400 and 410 show gate leakage current density ($J_g$) after modifying a $HfSiO_x$ high-k layer (~3 nm thick) with an oxygen-containing plasma generated at high gas pressure (2 Torr), and an oxygen-containing plasma generated at a low gas pressure (50 mTorr), respectively. FIG. 4A shows that a $HfSiO_x$ high-k layer modified using a high pressure oxygen-containing plasma has near identical gate current density as a $HfSiO_x$ high-k layer modified using a low pressure oxygen-containing plasma.

FIG. 4B shows the capacitance of a plasma modified gate dielectric stack as a function of gate voltage. Curves 420 and 430 show the capacitance (C) of a gate dielectric stack after modifying a $HfSiO_x$ high-k layer with an oxygen-containing plasma generated at a high process gas pressure, and an oxygen-containing plasma generated at a low process gas pressure, respectively. FIG. 4B shows that a $HfSiO_x$ high-k layer modified using a high pressure oxygen-containing plasma has a higher capacitance than a $HfSiO_x$ layer modified using a low pressure oxygen-containing plasma.

The equivalent oxide thickness (EOT) of the gate dielectric stack that was modified using a high-pressure oxygen-containing plasma was estimated to be about 1.5 nm, whereas the EOT of the gate dielectric stack that was modified using a high-pressure oxygen-containing plasma was estimated to be about 1.7 nm. The results in FIGS. 4A and 4B show that a low pressure oxygen-containing plasma modifies a high-k layer by decreasing the effective dielectric constant of the high-k layer, whereas a high pressure oxygen-containing plasma preserves the thinness of the interfacial oxide layer, thus maintaining the effective dielectric constant of the dielectric stack. The inventors believe that the high-pressure plasma minimizes the interfacial layer thickness increase during the plasma oxidation, reduces the defects in the layer, incorporates oxygen in the layer, removes carbon impurities from the layer, and yields a lower gate leakage current density than a film exposed to a low-pressure plasma.

Furthermore, the $J_g$ in FIG. 4A are comparable to high-k layers that have been annealed at high temperatures. Thus, embodiments of the current invention provide a method that can minimize high-temperature thermal budgets that can increase the thickness of the interfacial oxide layer.

Figure 5A:
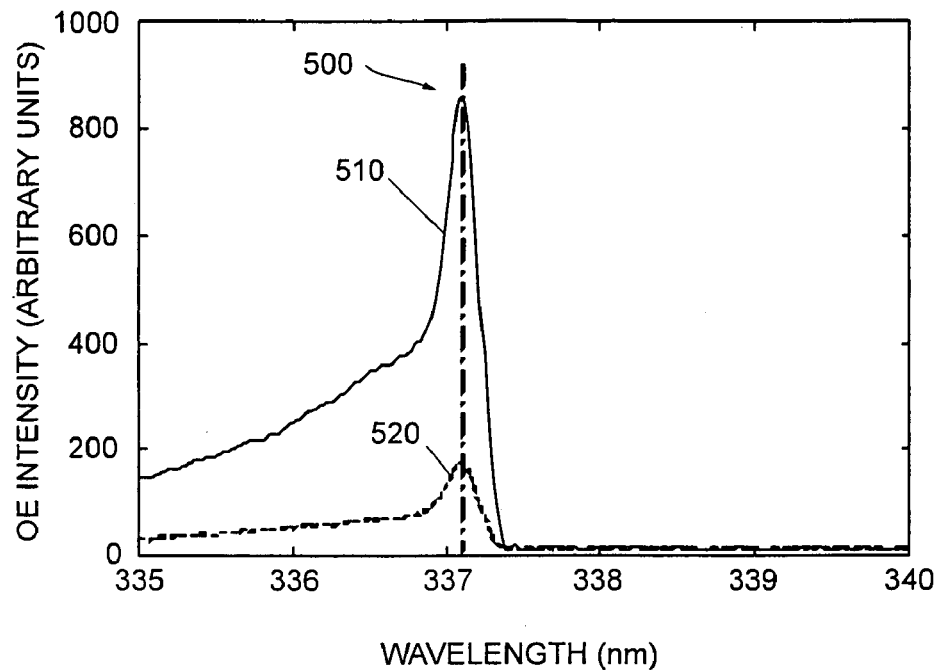
FIGS. 5A and 5B show OE intensity as a function of wavelength for a nitrogen-containing plasma according to an embodiment of the invention.
Figure 5B:
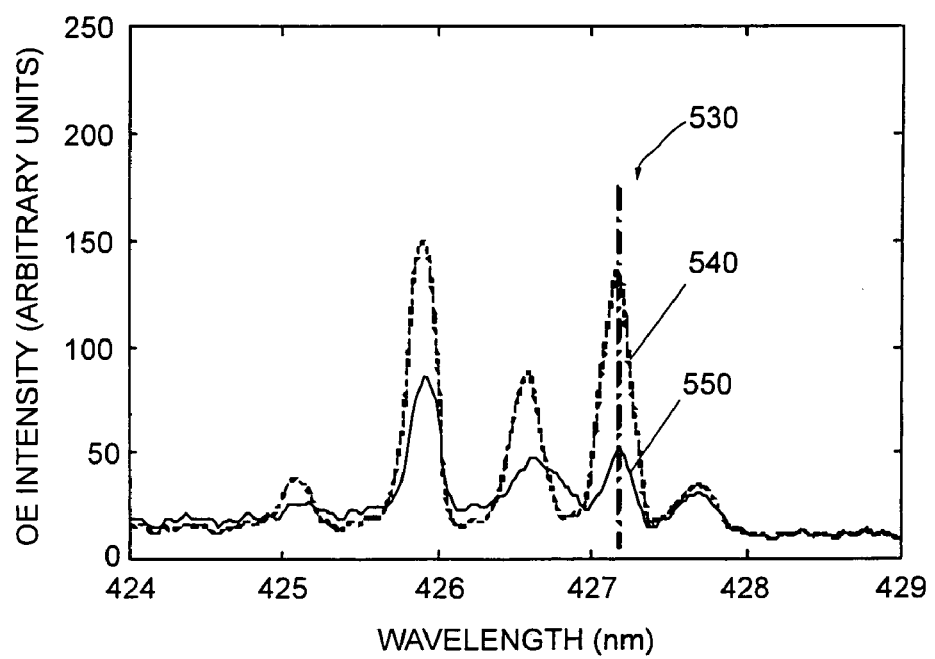

FIGS. 5A and 5B show OE intensity as a function of wavelength for a nitrogen-containing plasma according to an embodiment of the invention. A plasma processing system 101 schematically shown in FIG. 2B was utilized to generate plasma from a process gas containing $N_2$ and Ar. FIG. 5A shows an OE feature 500 with maximum intensity at a wavelength of about 337 nm that is assigned to light emission from neutral $N_2^*$ radicals in the plasma. Curve 510 shows the measured $N_2^*$ intensity for a process gas pressure of 200 mTorr, whereas curve 520 shows the measured $N_2^*$ intensity for a process gas pressure of 800 mTorr, respectively. The plasma parameters further included an Ar gas flow rate of about 1000 sccm, a $N_2$ gas flow rate of about 10 sccm, and plasma power of 2000 W. FIG. 5A shows that decreasing the process gas pressure from 800 mTorr to 200 mTorr decreases the amount of neutral $N_2^*$ radicals in the plasma.

FIG. 5B shows an OE feature 530 with maximum intensity at a wavelength of about 427.2 nm that is assigned to light emission from ionic $N_2^+$ radicals in the plasma. Curve 550 shows the measured $N_2^+$ intensity for a gas pressure of 800 mTorr, whereas curve 540 shows the measured $N_2^+$ intensity for a process gas pressure of 200 mTorr, respectively. Other plasma parameters were the same as in FIG. 5A. FIG. 5B shows that decreasing the process gas pressure increases the amount of ionic $N_2^+$ radicals in the plasma.

In summary, FIGS. 5A and 5B show that the relative amount of ionic $N_2^+$ radicals to neutral $N_2^*$ radicals in a nitrogen-containing plasma can be controlled over a wide range by varying the process gas pressure. In particular, a low process gas pressure allows for generating a nitrogen-containing plasma with an increased amount of ionic $N_2^+$ radicals relative to the amount of neutral $N_2^*$ radicals.

Figure 6A:
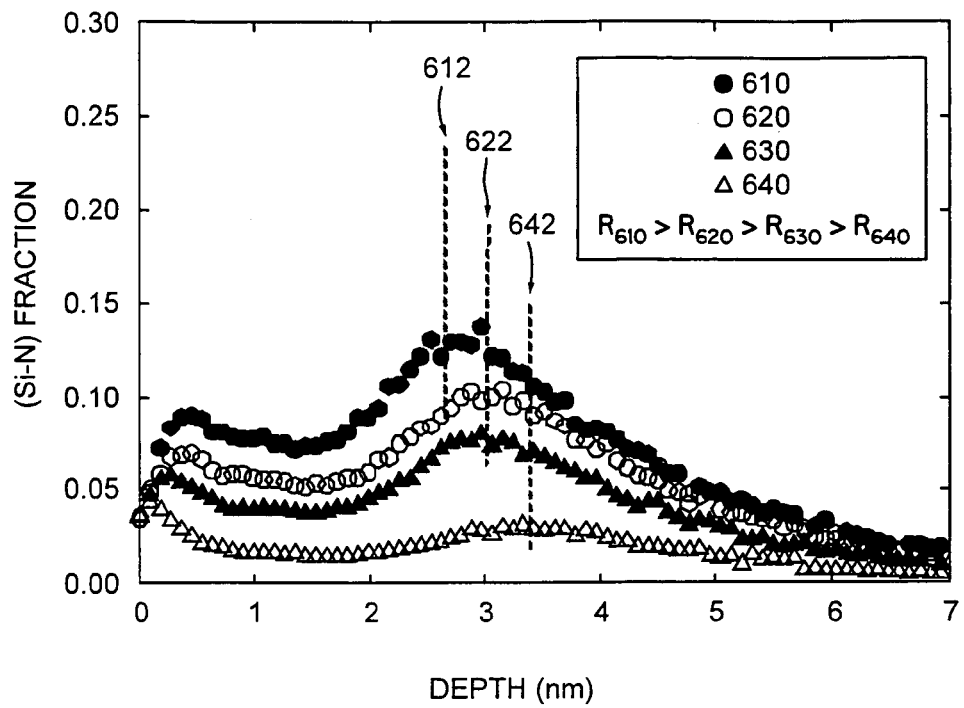
FIG. 6A shows nitrogen concentration profile in a gate dielectric stack as a function of plasma conditions and as a function of layer depth according to an embodiment of the invention.

FIG. 6A shows a nitrogen concentration profile in a gate dielectric stack as a function of plasma conditions and as a function of layer depth according to an embodiment of the invention. A gate dielectric stack containing a ~3 nm thick $HfSiO_x$ high-k layer deposited onto a substrate was exposed to a nitrogen-containing plasma generated from a process gas containing $N_2$ and Ar. The Si—N fraction indicates the relative amount of a nitrided interface layer. The Si—N fraction was measured by time-of-flight secondary ion mass spectroscopy (ToF—SIMS) and sputter depth profiling. Curves 610, 620, 630, and 640 show Si—N fraction in plasma modified gate dielectric stacks for different plasma conditions. The ratio (R) of ionic nitrogen radicals relative to neutral nitrogen radicals in the plasma decreases from Curve 610 through Curve 640.

FIG. 6A shows that a higher amount of ionic nitrogen radicals (i.e., $R_{610}$) in a plasma resulted in increased nitrogen incorporation into the gate dielectric stack and formation of a thinner nitrided interfacial layer. The location (depth) of the maximum nitrogen content was found to decrease with increasing amount of ionic radicals in the plasma, as shown by markers 612, 622, and 642, corresponding to maximum intensities for curves 610, 620, and 640, respectively.

Figure 6B:
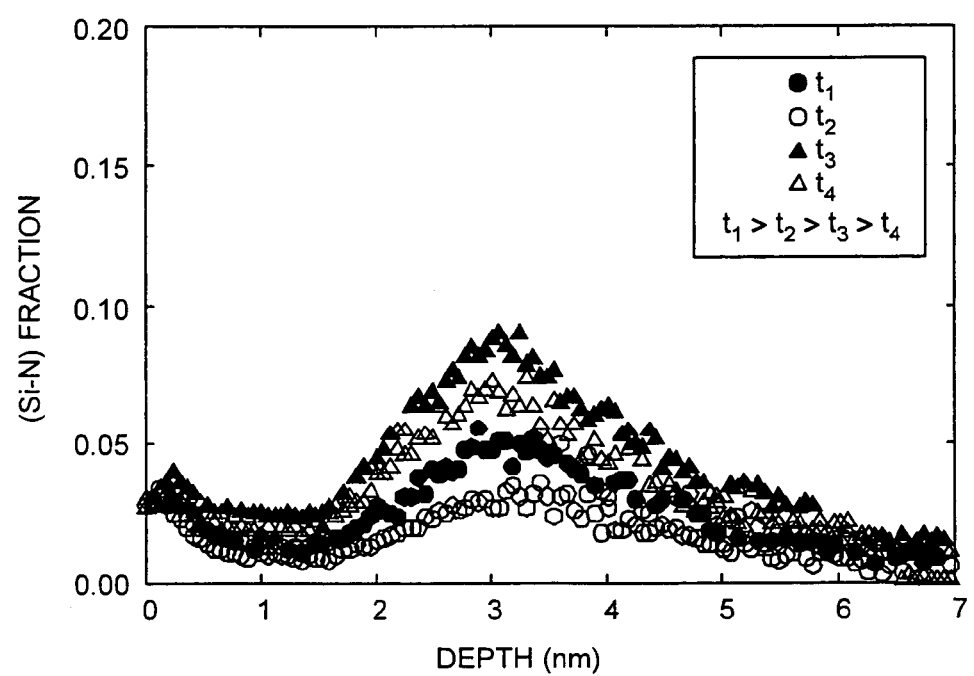
FIG. 6B shows nitrogen concentration profile in a gate dielectric stack as a function of plasma exposure time and as function of layer depth according to an embodiment of the invention.

FIG. 6B shows nitrogen content in a gate dielectric stack as a function of plasma exposure time and as function of layer depth according to an embodiment of the invention. The nitrogen content in the gate dielectric stack was found to increase with increasing plasma exposure time.

Figure 7:
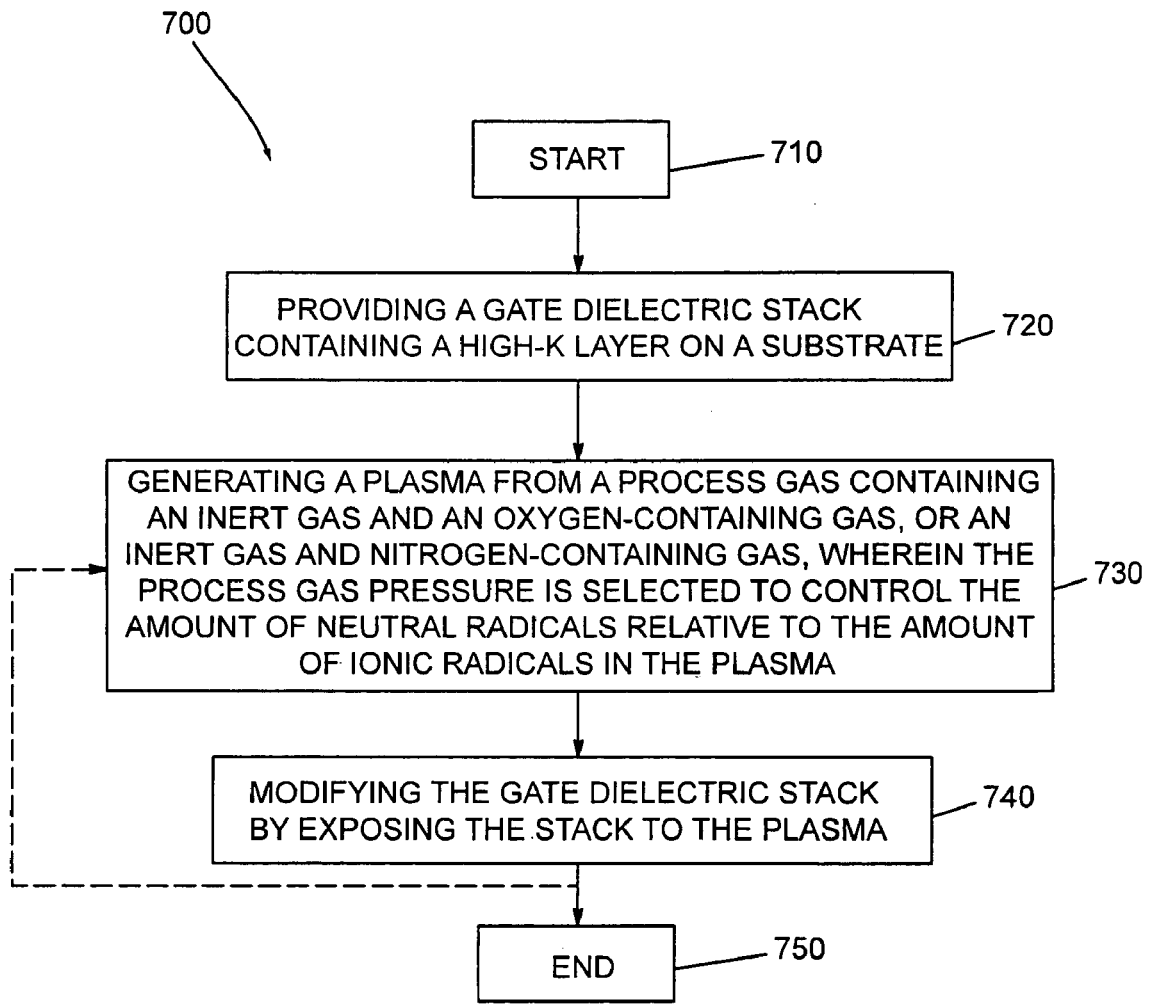
FIG. 7 is a flow chart for modifying a gate dielectric stack according to an embodiment of the invention.

FIG. 7 is a flowchart for modifying a gate dielectric stack according to an embodiment of the invention. The method uses a plasma process to modify the gate dielectric stack and improve the properties of the high-k layer while minimizing the growth of an interfacial layer on the substrate. The process 700 is started at 710. At 720, a gate dielectric stack containing a high-k layer on a substrate is provided. In one embodiment of the invention, the substrate can contain an interfacial layer located between the substrate and the high-k layer. At 730, plasma is generated from a process gas containing an inert gas and an oxygen-containing gas, or an inert gas and a nitrogen-containing gas, wherein the process gas pressure is selected to control the amount of neutral radicals relative to the amount of ionic radicals in the plasma.

In one embodiment of the invention, a plasma is generated at 730 from a process gas containing an inert gas and an oxygen-containing gas, where a high process gas pressure is selected to increase the amount of neutral oxygen radicals relative to the amount of ionic oxygen radicals in the plasma. The high-pressure oxygen-containing plasma is capable of modifying the gate dielectric stack by increasing the dielectric constant of the high-k layer through reducing defects in the layer, incorporating oxygen in the layer, and removing carbon impurities from the layer.

In another embodiment of the invention, plasma is generated at 730 from a process gas containing an inert gas and a nitrogen-containing gas, where a low process gas pressure is selected to increase the amount of ionic nitrogen radicals relative to the amount of neutral nitrogen radicals in the plasma. The low-pressure nitrogen-containing plasma is capable of increasing the nitrogen content of the gate dielectric stack and form a thin nitrided interfacial layer.

At 740, the stack is modified by exposing the stack to the high-pressure oxygen-containing plasma or the low-pressure nitrogen-containing plasma. When the plasma exposure has been carried out for the desired amount of time to modify the stack, the process is ended at 750. In one embodiment, the stack is exposed to the oxygen-containing plasma for a time period between about 5 seconds and about 60 seconds. In another embodiment the stack is exposed to the nitrogen-containing plasma for a time period between about 60 seconds and about 300 seconds. In either embodiment the substrate may be maintained at a temperature between about 150° C. and about 450° C. during the modification.

In yet another embodiment of the invention, a gate dielectric stack can be modified by exposure to a high-pressure oxygen-containing plasma, wherein the plasma contains increased amount of neutral oxygen radicals relative to the amount of ionic oxygen radicals in the plasma and, subsequently, the resulting stack can be further modified by exposure to a low-pressure nitrogen-containing plasma, wherein the plasma contains an increased amount of ionic nitrogen radicals relative to the amount of neutral nitrogen radicals in the plasma. In other words, 730 and 740 are performed a first time using the high-pressure oxygen-containing plasma, and then 730 and 740 are performed a second time, as indicated by the dashed line in FIG. 7, using the low-pressure nitrogen-containing plasma, and then the process is ended at 750.

In still another embodiment of the invention, a gate dielectric stack can be modified by exposure to a low-pressure nitrogen-containing plasma, wherein the plasma contains an increased amount of ionic nitrogen radicals relative to the amount of neutral nitrogen radicals in the plasma and, subsequently, the resulting stack can be further modified by exposure to a high-pressure oxygen-containing plasma, wherein the plasma contains increased amount of neutral oxygen radicals relative to the amount of ionic oxygen radicals in the plasma. In other words, 730 and 740 are performed a first time using the low-pressure nitrogen-containing plasma, and then 730 and 740 are performed a second time, as indicated by the dashed line in FIG. 7, using the high-pressure oxygen-containing plasma, and then the process is ended at 750.

As will readily be understood by one skilled in the sit, the high-pressure oxygen-containing plasma process and the low-pressure nitrogen-containing plasma processes described above, can be performed sequentially in the same plasma processing system within a cluster tool or, alternatively, they can be performed in different plasma processing systems within the same cluster tool. The cluster tool can further contain a substrate transfer system configured for transferring substrates within the cluster tool, and a controller configured to control the components of the cluster tool.

It should be understood that various modifications and variations of the present invention may be employed in practicing the invention. It is therefore to be understood that, within the scope of the appended claims, the invention may be practiced otherwise than as specifically described herein.

What is claimed is:

1. A method for modifying a gate dielectric stack, the method comprising:
    providing a gate dielectric stack having a high-k metal oxide or metal silicate layer formed on a substrate, wherein the high-k metal oxide or metal silicate layer has an effective dielectric constant;
    generating a first plasma comprising an amount of neutral oxygen radicals and an amount of ionic oxygen radicals from a first process gas containing a first inert gas and an oxygen-containing gas, and selecting a pressure for the first process gas effective to increase the amount of neutral oxygen radicals relative to the amount of ionic oxygen radicals in the first plasma; and
    modifying the gate dielectric stack by exposing the gate dielectric stack to the first plasma.

2. The method according to claim 1, wherein the substrate comprises a Si substrate, a Ge-containing Si substrate, a Ge substrate, or a compound semiconductor substrate.

3. The method according to claim 1, wherein the high-k layer comprises $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, $LaSiO_x$, $YO_x$, or $YSiO_x$, or a combination of two or more thereof.

4. The method according to claim 1, wherein the oxygen-containing gas comprises $O_2$, $O_3$, $H_2O$, or $H_2O_2$, or a combination of two or more thereof.

5. The method according to claim 1, wherein the first inert gas comprises He, Ar, He, Kr, or Xe, or a combination of two or more thereof.

6. The method according to claim 1, wherein the first process gas pressure is between about 0.5 Torr and about 5 Torr.

7. The method according to claim 1, wherein the first process gas pressure is between about 1 Torr and about 3 Torr.

8. The method according to claim 1, wherein the ratio of the first inert gas to the oxygen-containing gas is between about 20 and about 5.

9. The method according to claim 1, wherein the first process gas comprises Ar and $O_2$.

10. The method according to claim 9, wherein the $Ar/O_2$ ratio is between about 20 and 5.

11. The method according to claim 1, further comprising maintaining the substrate at a temperature between about 150° C. and about 450° C. during the modifying.

12. The method according to claim 1, wherein the modifying comprises exposing the gate dielectric stack to the first plasma for a time period between about 5 sec and about 60 sec.

13. The, method according to claim 1, wherein the gate dielectric stack further comprises an interfacial layer between the high-k layer and the substrate.

14. The method according to claim 13, wherein the modifying is performed for a time sufficient to increase the effective dielectric constant of the high-k layer through at least one of minimizing the interfacial layer, reducing defects in the high-k layer, incorporating oxygen in the high-k layer, or removing carbon impurities from the high-k layer.

15. The method according to claim 13, wherein the interfacial layer comprises an oxide layer, a nitride layer, or an oxynitride layer.

16. The method according to claim 1, further comprising:
    generating a second plasma comprising an amount of ionic nitrogen radicals and an amount of neutral nitrogen radicals from a second process gas containing a second inert gas and a nitrogen-containing gas, and selecting a pressure for the second process gas effective to increase the amount of ionic nitrogen radicals relative to the amount of neutral nitrogen radicals in the second plasma; and
    exposing the modified gate dielectric stack to the second plasma without the first plasma.

17. The method according to claim 16, wherein the nitrogen-containing gas comprises $N_2$ or $NH_3$, or a combination thereof.

18. The method according to claim 16, wherein the second inert gas comprises He, Ar, He, Kr, or Xe, or a combination of two or more thereof.

19. The method according to claim 16, wherein the second process gas pressure is between about 10 mTorr and about 400 mTorr.

20. A method for modifying a gate dielectric stack, the method comprising:
    providing a gate dielectric stack having a high-k layer formed on a substrate;
    generating a first plasma comprising an amount of ionic nitrogen radicals and an amount of neutral nitrogen radicals from a first process gas containing a first inert gas and a nitrogen-containing gas, and selecting a pressure for the first process gas effective to increase the amount of ionic nitrogen radicals relative to the amount of neutral nitrogen radicals in the first plasma;
    modifying the gate dielectric stack by exposing the gate dielectric stack to the first plasma;
    generating a second plasma comprising an amount of neutral oxygen radicals and an amount of ionic oxygen radicals from a second process gas containing a second inert gas and an oxygen-containing gas, and selecting a pressure for the second process gas effective to increase the amount of neutral oxygen radicals relative to the amount of ionic oxygen radicals in the second plasma; and
    exposing the modified gate dielectric stack to the second plasma without the first plasma.

21. The method according to claim 20, wherein the substrate comprises a Si substrate, a Ge-contained Si substrate, a Ge substrate, or a compound semiconductor substrate.

22. The method according to claim 20, wherein the high-k layer comprises a metal oxide layer or a metal silicate layer.

23. The method according to claim 20, wherein the high-k layer comprises $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, $LaSiO_x$, $YO_x$, or $YSiO_x$, or a combination of two or more thereof.

24. The method according to claim 20, wherein the nitrogen-containing gas comprises $N_2$ or $NH_3$, or a combination thereof.

25. The method according to claim 20, wherein the first inert gas comprises He, Ar, He, Kr, or Xe, or a combination of two or more thereof.

26. The method according to claim 20, wherein the first process gas pressure is between about 10 mTorr and about 400 mTorr.

27. The method according to claim 20, wherein the first process gas pressure is between about 50 mTorr and about 300 mTorr.

28. The method according to claim 20, wherein the ratio of the first inert gas to the nitrogen-containing gas is between about 20 and about 500.

29. The method according to claim 20, wherein the first process gas comprises Ar and $N_2$.

30. The method according to claim 20, wherein the $Ar/N_2$ ratio is between about 20 and about 500.

31. The method according to claim 20, further comprising maintaining the substrate at a temperature between about 150° C. and about 450° C. during the modifying.

32. The method according to claim 20, wherein the gate dielectric stack is exposed to the first plasma for a time period between about 60 sec and about 300 sec.

33. The method according to claim 20, wherein the modifying is performed for a time sufficient to increase the nitrogen content of the high-k layer.

34. The method according to claim 20, wherein the gate dielectric stack further comprises an interfacial layer between the high-k layer and the substrate.

35. The method according to claim 34, wherein the interfacial layer comprises an oxide layer, a nitride layer, or an oxynitride layer.

36. The method according to claim 20, wherein the oxygen-containing gas comprises $O_2$, $O_3$, $H_2O$, or $H_2O_2$, or a combination of two or more thereof.

37. The method according to claim 20, wherein the second inert gas comprises He, Ar, He, Kr, or Xe, or a combination of two or more thereof.

38. The method according to claim 20, wherein the second process gas pressure is between about 0.5 Torr and about 5 Torr.

39. The method according to claim 20, wherein the second process gas pressure is between about 1 Torr and about 3 Torr.

40. A method for modifying a gate dielectric stack, the method comprising:

providing a gate dielectric stack having a high-k layer formed on a substrate;

generating a first plasma comprising an amount of neutral oxygen radicals and an amount of ionic oxygen radicals from a first process gas containing a first inert gas and an oxygen-containing gas, and selecting a pressure for the first process gas effective to increase the amount of neutral oxygen radicals relative to the amount of ionic oxygen radicals in the first plasma;

modifying the gate dielectric stack by exposing the gate dielectric stack to the first plasma;

generating a second plasma comprising an amount of ionic nitrogen radicals and an amount of neutral nitrogen radicals from a second process gas containing a second inert gas and a nitrogen-containing gas, and selecting a pressure for the second process gas effective to increase the amount of ionic nitrogen radicals relative to the amount of neutral nitrogen radicals in the second plasma; and exposing the modified gate dielectric stack to the second plasma without the first plasma.

41. The method according to claim 40, wherein the substrate comprises a Si substrate, a Ge-containing Si substrate, a Ge substrate, or a compound semiconductor substrate.

42. The method according to claim 40, wherein the oxygen-containing gas comprises $O_2$, $O_3$, $H_2O$, or $H_2O_2$, or a combination of two or more thereof.

43. The method according to claim 40, wherein each of the first inert gas and the second inert gas comprises He, Ar, He, Kr, or Xe, or a combination of two or more thereof.

44. The method according to claim 40, wherein the first process gas pressure is between about 0.5 Torr and about 5 Torr.

45. The method according to claim 40, wherein the ratio of the first inert gas to the oxygen-containing gas is between about 20 and about 5.

46. The method according to claim 40, further comprising maintaining the substrate at a temperature between about 150° C. and about 450° C. during the modifying.

47. The method according to claim 40, wherein the modifying comprises exposing the gate dielectric stack to the first plasma for a time period between about 5 sec and about 60 sec.

48. The method according to claim 40, wherein the gate dielectric stack further comprises an interfacial layer between the high-k layer and the substrate.

49. The method according to claim 48, wherein the interfacial layer comprises an oxide layer, a nitride layer, or an oxynitride layer.

50. The method according to claim 40, wherein the nitrogen-containing gas comprises $N_2$ or $NH_3$, or a combination thereof.

51. The method according to claim 40, wherein the second process gas pressure is between about 10 mTorr and about 400 mTorr.

* * * * *

UNITED STATES PATENT AND TRADEMARK OFFICE
CERTIFICATE OF CORRECTION

PATENT NO. : 7,163,877 B2  Page 1 of 1
APPLICATION NO. : 10/920990
DATED : January 16, 2007
INVENTOR(S) : Niimi et al.

It is certified that error appears in the above-identified patent and that said Letters Patent is hereby corrected as shown below:

Title Page Item (56) OTHER PUBLICATIONS, line 16, "Ultra-thin SiO," should read --Ultra-thin $SiO_2$--.
Title Page Item (56) OTHER PUBLICATIONS, line 18, "Si-Oxide/SlNltride" should read --Si-Oxide/Si Nitride--.
Title Page 2 Item (56) OTHER PUBLICATIONS, line 2, "Appled" should read --Applied--.
Col. 1, line 19, "complimentary" should read --complementary--.
Col. 4, line 12, "contain higher amount" should read --contains higher amounts--.
Col. 4, line 19, "increased amount" should read --an increased amount--.
Col. 6, line 56, "network 1.35," should read --network 135,--.
Col. 8, line 51, "higher capacitance" should read --lower capacitance--.
Col. 9, line 18, "of 200m Torr" should read --of 800m Torr--.
Col. 9, line 19, "of 800m Torr" should, read --of 200m Torr--.
Col. 11, line 11, "in the sit" should read --in the art--.
Col. 11, line 14, "described above, can be" should read --described above can be--.
Col. 11, line 53, "He, Ar, He, Kr" should read --He, Ar, Ne, Kr--.
Col. 12, line 8, "The, method" should read --The method--.
Col. 12, line 36, "He, Ar, He, Kr" should read --He, Ar, Ne, Kr--.
Col. 13, line 11, "He, Ar, He, Kr" should read --He, Ar, Ne, Kr--.
Col. 13, line 45, "He, Ar, He, Kr" should read --He, Ar, Ne, Kr--.
Col. 14, lines 28 and 29, "He, Ar, He, Kr" should read --He, Ar, Ne, Kr--.

Signed and Sealed this

Twenty-sixth Day of June, 2007

JON W. DUDAS
*Director of the United States Patent and Trademark Office*